(12) United States Patent
Chaware et al.

(10) Patent No.: US 7,863,092 B1
(45) Date of Patent: Jan. 4, 2011

(54) LOW COST BUMPING AND BONDING METHOD FOR STACKED DIE

(75) Inventors: Raghunandan Chaware, Sunnyvale, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 98 days.

(21) Appl. No.: 12/242,492

(22) Filed: Sep. 30, 2008

(51) Int. Cl.
  *H01L 21/44* (2006.01)
  *H01L 21/48* (2006.01)
  *H01L 21/50* (2006.01)

(52) U.S. Cl. .................. 438/106; 438/107; 438/109; 438/127

(58) Field of Classification Search .......... 257/737; 438/106, 107, 108, 109–110, 112, 114, 124, 438/125, 126, 127
See application file for complete search history.

(56) References Cited

U.S. PATENT DOCUMENTS

2004/0259288 A1* 12/2004 Mostafazadeh et al. ...... 438/106
2007/0164409 A1*  7/2007 Holland ....................... 257/678

* cited by examiner

*Primary Examiner*—Chuong A. Luu
(74) *Attorney, Agent, or Firm*—Michael R. Hardaway; Thomas George; LeRoy D. Maunu

(57) ABSTRACT

Disclosed is a method of fabricating an integrated circuit assembly in which a plurality of mother dice having a plurality of through-die vias (TDVs) are formed in the first (active) surface of a semiconductor wafer, a substrate is attached to the active surface of the wafer, the second (inactive) surface is back-ground to expose one end of the through-die vias, a plurality of daughter dice are mounted to the inactive surface of the wafer, each daughter die being electrically coupled to a mother die, and the mother dice are then singulated. Attaching the substrate can be accomplished by adhering a glass wafer carrier to the wafer. The wafer carrier allows handling of the wafer during back-grinding the inactive surface, forming under-bump metal (UBM) pads on the TDVs and attaching the daughter dice.

19 Claims, 10 Drawing Sheets

(SEC. A-A)

(SEC. A-A)

(SEC. A-A)

(SEC. A-A)

(SEC. A-A)

(SEC. A-A)

(SEC. A-A)

(SEC. A-A)

LOW COST BUMPING AND BONDING METHOD FOR STACKED DIE

FIELD OF THE INVENTION

The present application relates generally to integrated circuits, and in particular, to a stacked-die integrated circuit assembly and methods of forming the same.

BACKGROUND OF THE INVENTION

Modern integrated circuit devices continue to shrink in size as they accelerate in speed. More and more functionality is demanded of less and less device "real estate" or available circuit space, whether on the printed circuit board of an electronic appliance or on the semiconductor die in which integrated circuits are formed.

Existing integrated circuits are essentially two-dimensional in that they are formed on the surface of flat semiconductor wafers. Until the advent of the stacked-die assembly, notwithstanding the development of limited multi-layer circuitry, the only ways to increase the complexity of a circuit were to increase the area of semiconductor used or to shrink feature size.

Stacked die technology has taken semiconductor fabrication into the third dimension, allowing a potentially large number of stacked dice to put very complex devices into small appliance footprints. The additional advantage of thin wafer technology combines to put very complex circuitry in the same footprint as a single die.

Stacking dice, though, brings on new challenges. Stacking requires that a daughter die be attached to a mother die, typically by an array of solder bumps, and requires that the mother die have contactable points on both surfaces. This means that both surfaces of the mother die must be addressed during processing.

Dual-surface processing requires some means of holding the die in a processing fixture. The holding and manipulation is hampered by the fragility of circuitry formed in the surface of the die and, if formed, the presence of solder bumps. These handling difficulties add expense, complexity and time to the fabrication process. Furthermore, because dice are typically stacked on solder bump arrays, the issues that must be dealt with include alleviating mechanical stresses as well as assuring electrical connectivity during manufacturing.

SUMMARY OF THE INVENTION

Embodiments of the present invention provide a low cost method for fabricating stacked-die integrated circuit assemblies. Disclosed embodiments enable the fabrication of stacked die assemblies using thin and fragile semiconductor wafers. The methods disclosed allow for multiple daughter dice to be stacked on a wafer of mother die before the mother die are singulated, thus without resorting to the expensive handling required of individual mother dice.

Disclosed is a method of fabricating an integrated circuit assembly in which a plurality of mother dice having a plurality of through-die vias (TDVs) are formed in the first surface of a semiconductor wafer, a substrate is attached to the active surface of the wafer, the second surface is back-ground to expose one end of the through-die vias, plurality of daughter dice are mounted to the inactive surface of the wafer, each daughter die being electrically coupled to a mother die, and the mother dice are then singulated. Attaching the substrate can be accomplished by adhering a glass wafer carrier to the wafer. The wafer carrier allows handling of the wafer during back-grinding the inactive surface, forming under-bump metal (UBM) pads on the TDVs and attaching the daughter dice.

In one embodiment, the substrate is a packaging substrate that also enables carrying and handling the semiconductor wafer. This allows the substrate to stay attached to the mother die and results in a packaged integrated circuit assembly upon singulation.

These and other advantages of the present invention will be obvious to those of ordinary skill in the art after reading the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
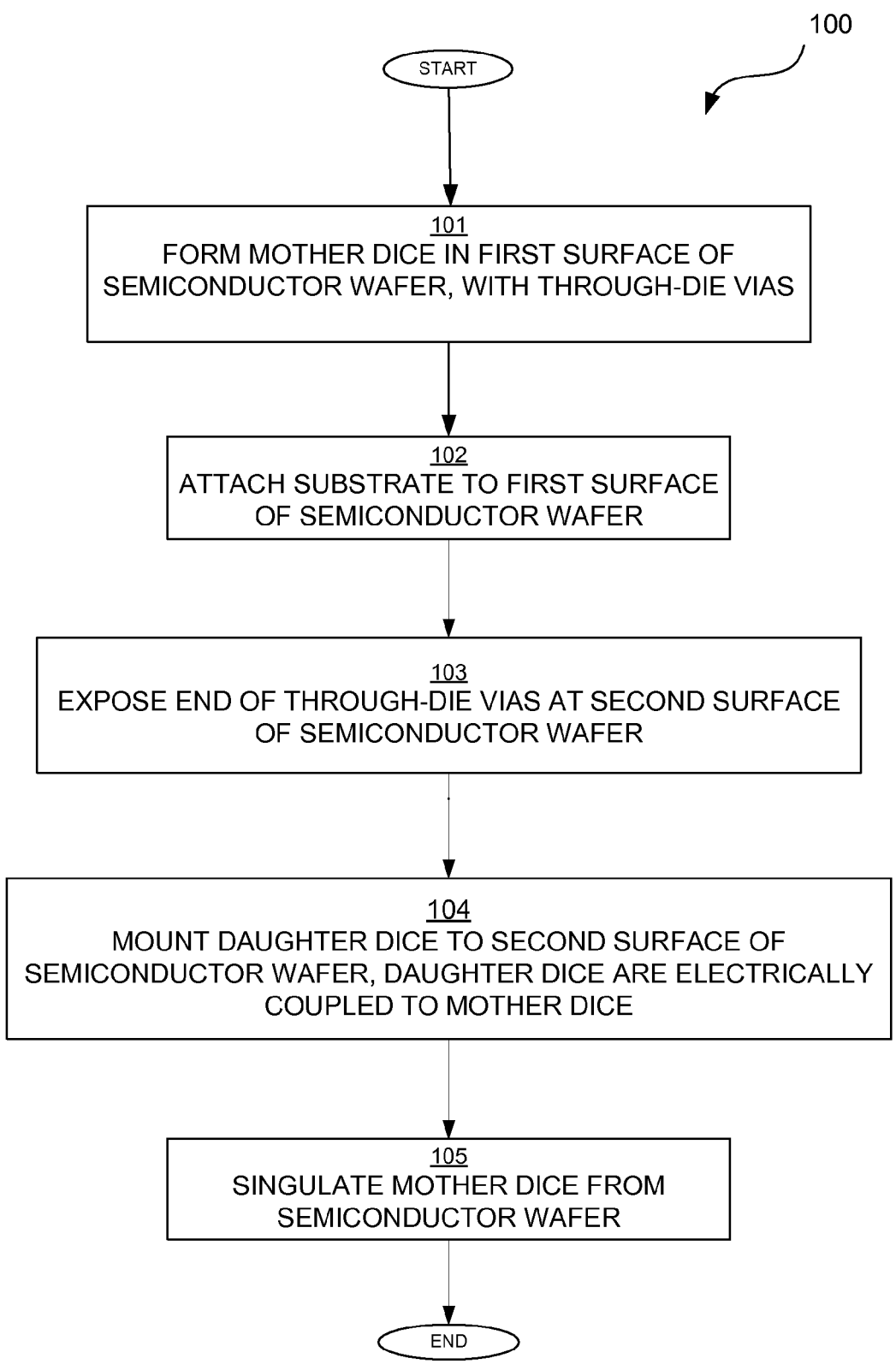
FIG. 1 shows a flow chart illustrating a method of fabricating an integrated circuit, in accordance with an embodiment of the present invention.

FIG. 1 illustrates a flow chart outlining a method of fabricating an integrated circuit assembly in accordance with an embodiment of the present invention. Method 100 begins with the formation of mother die integrated circuits in a semiconductor wafer 100. In this description, it is noted, "mother die" is used to denote an integrated circuit that is enabled to accept connection to a stacked daughter die. Mother dice can be formed by any semiconductor fabrication technology that results in one or more mother dice being formed in a semiconductor wafer.

In an embodiment of the present invention, the mother die includes one or more through-die vias (TDVs), also known as through-silicon vias (TSVs). The through-die via enables, in this embodiment, the coupling of a stacked daughter die to the mother die. The stacking of a daughter die enables adding complex additional circuitry to the mother die without increasing the integrated circuit footprint.

After formation of the mother dice, a substrate is attached to the semiconductor wafer 102. In one embodiment, the substrate is a wafer carrier, intended to support the wafer during further processing. The substrate can be attached with an adhesive. The substrate can be glass or other suitable material that provides support to the wafer, which can have a thickness on the order of 100 µm, or can be even thinner. Such thin wafers are fragile; however, in another embodiment, a wafer can be processed without the attachment of a substrate carrier. In another embodiment, the substrate can be a packaging substrate. In this embodiment, the packaging substrate is electrically coupled to the mother dice and is enabled to provide electrical connection to the outside world. A packaging substrate can be attached by solder bumps or other attachment means that provide electrical connection.

In the present embodiment, the substrate is a glass wafer carrier, suitable to adapt the active, or first, surface of the wafer to be held by a vacuum chuck or other retention device. With the substrate attached, the wafer can be positioned such that the inactive, or second, surface can be processed. In one embodiment, the wafer is thinned by back-grinding the second surface. The purpose of the thinning, in this embodiment, is to expose the ends of the through-silicon vias as at step 103. In another embodiment, the thinning is accomplished by another means.

It is noted here that through-silicon vias can be formed by various processes. During such formation, the through-silicon vias are often formed nearly, but not completely, through the wafer. This requires that the wafer be thinned or polished so that the ends of the through-silicon vias are exposed to further processing and connection to other elements, such as, for example, a daughter die.

Once the ends of the through-silicon vias are exposed as at 103, they can be processed for electrical connection. In one embodiment, the through-silicon vias are capped by under-bump metallization that forms contact pads for the solder bumps used to provide electrical coupling to a daughter die. Daughter dice, in this embodiment, are attached to the semiconductor wafer's second surface at step 104.

In some embodiments, the daughter dice are under-filled after attachment in order to provide thermal and mechanical protection to the dice and their respective solder bump connections. Under-filling can be with epoxy or other suitable material. In another embodiment, under-filling is followed by back-filling the space between daughter dice with a suitable material. The back-filling material can be any material that enables a leveling or planarization of the side of the wafer on which the daughter dice are attached. One purpose of this can be to provide a gripping surface for further processing. In yet another embodiment, the material used in the back-filling can be a packaging material.

At step 105, the wafer is singulated to separate the mother dice. The singulation can also be known as dicing. In one embodiment, the singulating, or dicing, is accomplished by reference to the cut lines inherently found between mother dice on the active surface of the wafer. In this embodiment, the wafer is held by a vacuum chuck on the side on which the daughter dice are attached. The carrier substrate is removed, along with its adhesive, exposing the cut lines to the singulating apparatus.

In an embodiment in which the carrier substrate is a packaging substrate, the substrate is not removed but is singulated along with the mother/daughter dice assemblies. In this embodiment, the wafer can be held or retained by either side.

In another embodiment, singulating is accomplished while the wafer is held by the substrate. In this embodiment, the mother/daughter dice assemblies are removed from the substrate after singulation.

Figure 2:
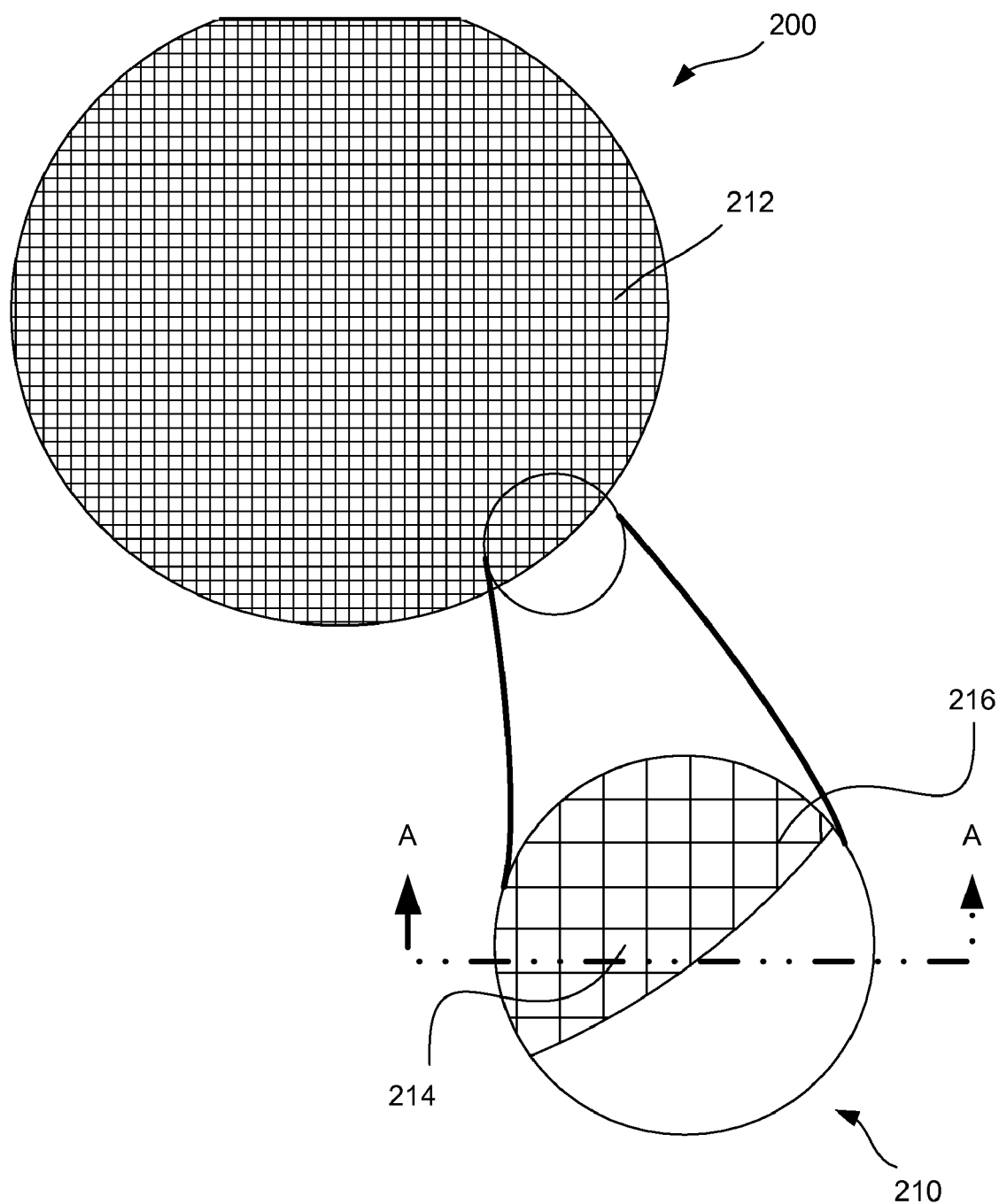
FIG. 2 illustrates, with detail, an exemplary semiconductor wafer, in accordance with an embodiment of the present invention.

FIG. 2 illustrates an exemplary semiconductor wafer during fabrication processing. Wafer 200 has a plurality of integrated circuit dice 212 formed in its active surface. The integrated circuit dice can be of any type. However, in various embodiments of the present invention, the fabricated integrated circuits are enabled to be the mother dice of stacked-die assemblies.

Detail 210 in FIG. 2 shows mother die 214 and section A-A. Also shown are cut lines 216. During fabrication, in some embodiments, cut lines 216 are resultant of the space between adjacent mother dice. Cut-lines 216 may also be known as scribe-lines.

Figure 3A:
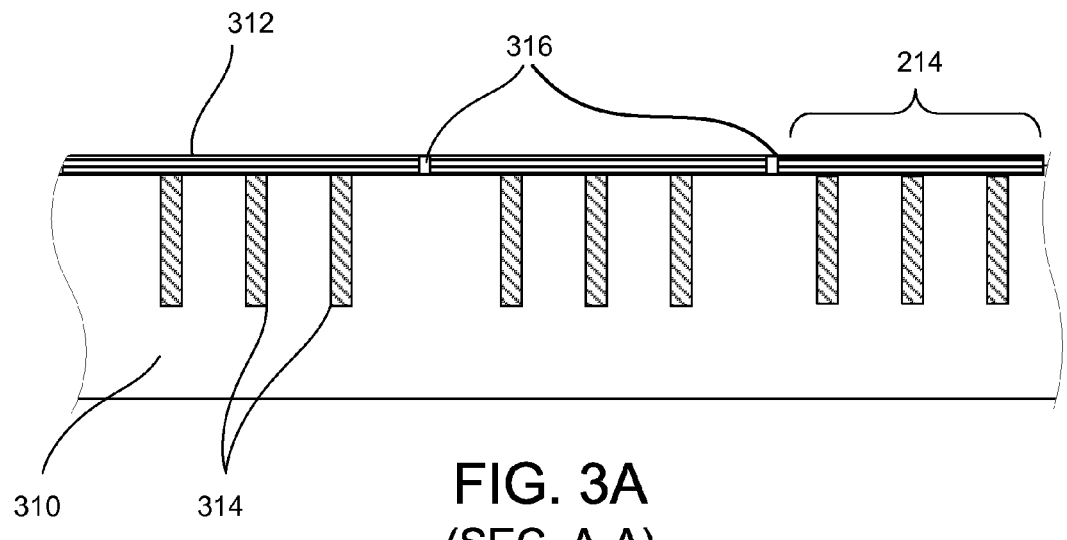
FIG. 3A illustrates a cross-section of a semiconductor wafer during mother die fabrication, in accordance with an embodiment of the present invention.

Referring now to FIG. 3A, section A-A of FIG. 2 is shown. Semiconductor wafer 310 is shown having in its first surface (the top surface in FIG. 3A) a plurality of integrated circuits 312. Mother die 214 is an integrated circuit of the plurality of integrated circuits. Adjacent mother dice are separated, in this embodiment, by spaces 316 that are also known as cut lines. Because of the appearance of a semiconductor wafer under a microscope evocative of a city map, cut lines 316 are sometimes called streets.

Also shown in FIG. 3A are through-silicon vias 314. In one embodiment of the present invention, the through-silicon vias are fabricated through most, but not all, of the thickness of the semiconductor wafer.

Figure 3B:
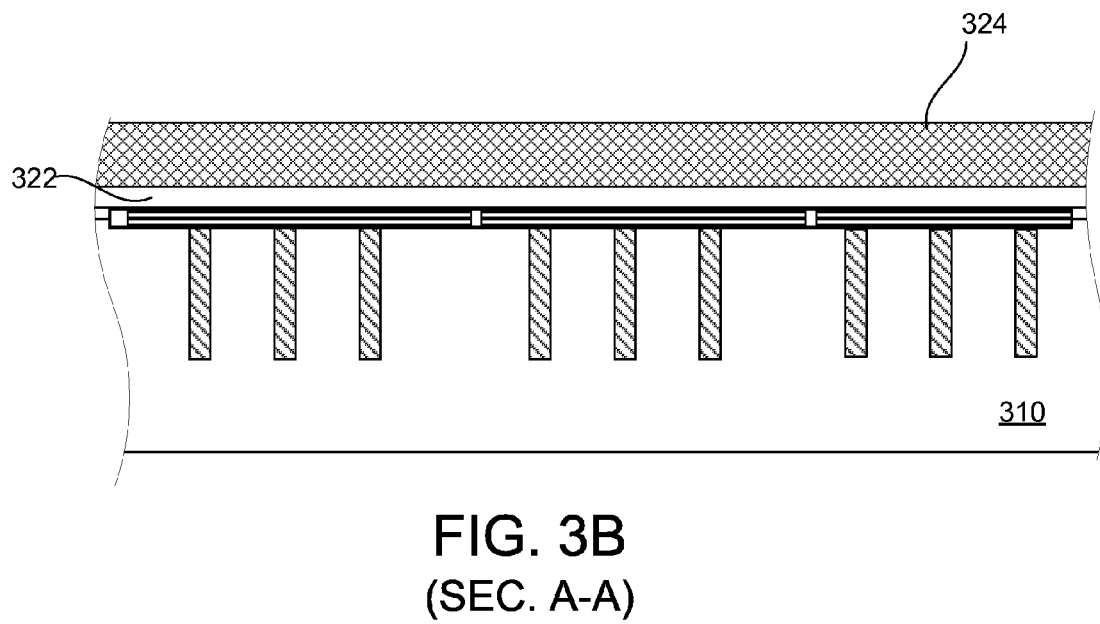
FIG. 3B illustrates a cross-section of a semiconductor wafer during attachment of a substrate, in accordance with an embodiment of the present invention.

In FIG. 3B, a substrate 324 is attached to semiconductor wafer 310 by means of an adhesive 322. In one embodiment, the substrate 324 is a glass wafer carrier that enables handling of a very thin wafer. In another embodiment, the substrate 324 is a packaging substrate. In this embodiment, substrate 324 has formed in it a plurality of connectivity arrays, examples of which can be pads and vias for a solder ball array, connection pads for wire bond, or any other connection means. In an embodiment in which substrate 324 is a packaging substrate, the substrate can be attached to the semiconductor wafer by any means that allows for electrical connectivity to the mother dice of the wafer. In these descriptions of various embodiments, however, illustrative descriptions are focused on embodiments in which substrate 324 is a glass carrier substrate.

Figure 3C:
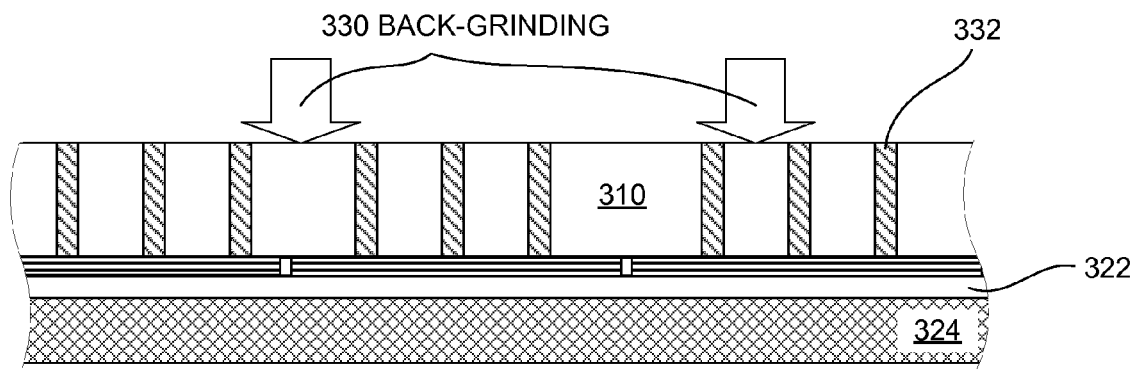
FIG. 3C illustrates a cross-section of a semiconductor wafer undergoing back-grinding during fabrication, in accordance with an embodiment of the present invention.
Figure 3D:
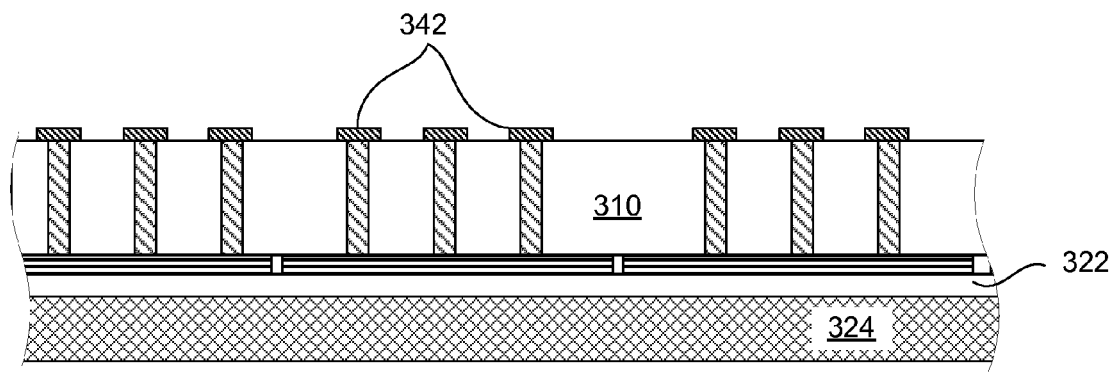
FIG. 3D illustrates a cross-section of a semiconductor wafer after under-bump metallization, in accordance with an embodiment of the present invention.

FIG. 3C illustrates the semiconductor wafer 310 while undergoing back-grinding, 330. It is noted here that the wafers illustrated in FIGS. 3C-3D are shown as being inverted from the view shown in FIG. 3B. In this illustration, semiconductor wafer 310 is held by wafer carrier substrate 324, which is attached to the first, or active, surface of the wafer by adhesive 322. The result of back-grinding 330 is the exposure of the back ends of through-silicon vias 332.

FIG. 3D illustrates an embodiment wherein under-bump metal pads 342 are formed on the exposed ends of the through-die vias 332. The under-bump metal pads provide a contact point for subsequent attachment of daughter dice by means of solder bumps.

Figure 3E:
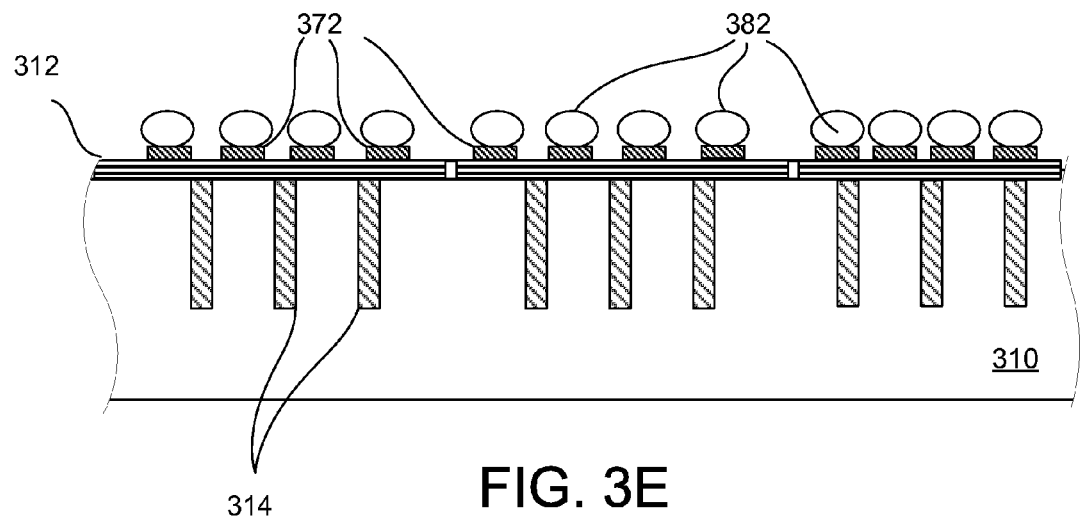
FIG. 3E-3H illustrate an alternative embodiment wherein mother-die solder bumping occurs before the substrate is attached, in accordance with an embodiment of the present invention.

FIGS. 3E-3H illustrate an embodiment of the present invention in which the mother dice are given under-bump metal pads and solder bumps before the daughter dice are attached. In FIG. 3E, under-bump metal pads 372 are connected to the contact points of mother die circuitry 312. Solder bumps 382 are then formed on under-bump metal pads 372. In this embodiment, solder bumps 382 have a slightly higher melting point than the solder bumps that will subsequently attach daughter dice to the mother dice. The difference in melting point can be on the order of 20 degrees C., for example. The difference in melting point allows daughter dice attachment, which can involve heating the daughter dice solder bumps, to take place without disturbing the mother dice solder bumps. In such an embodiment, subsequent mother die attachment, which may involve heating the mother-die solder bumps, does not affect the daughter-die solder bumps because of thermal protection provided by under filling of the daughter dice.

Figure 3F:
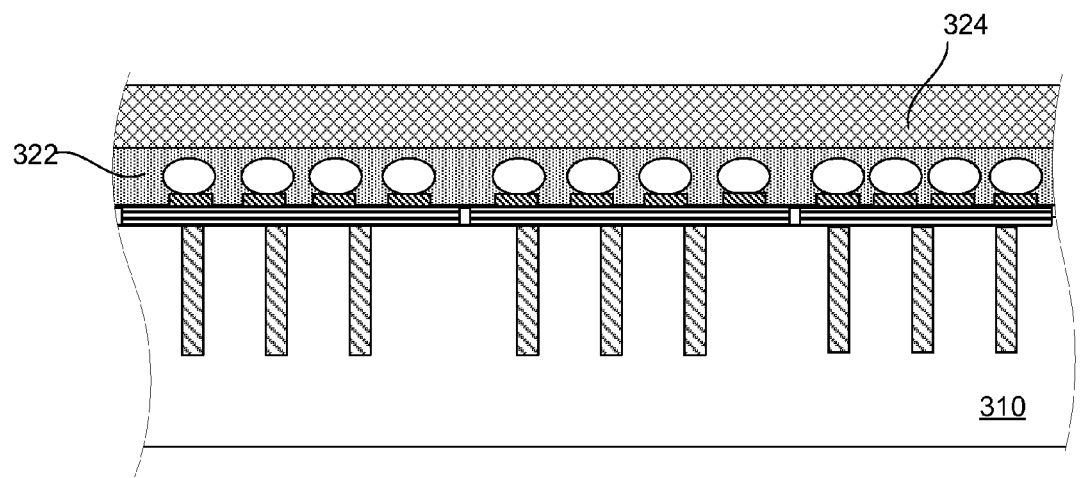

After metallization and bumping, in this embodiment, the substrate 324 is attached to semiconductor wafer 310 as shown in FIG. 3F. That figure shows substrate 324 being attached by adhesive layer 322. Adhesive 322 can be of any type suitable to attaching and handling the semiconductor wafer. In this embodiment, the adhesive used is able to bond over the mother-die solder bumps 382 without disturbing them. For eventual removal of the adhesive, it is enabled to be etched or dissolved from the semiconductor wafer without affecting the mother die solder bumps.

Figure 3G:
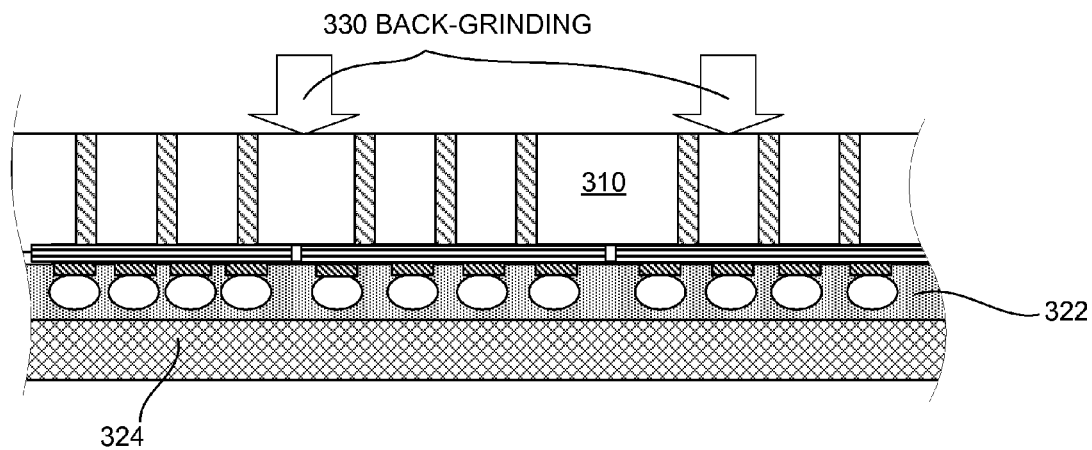

With the substrate attached and providing the necessary handling capabilities, semiconductor wafer 310 is inverted, as shown in FIG. 3G, to present the second surface to processing. In this embodiment, the second surface is reduced by back-grinding 330 to expose the ends of through-die vias 332.

Figure 3H:
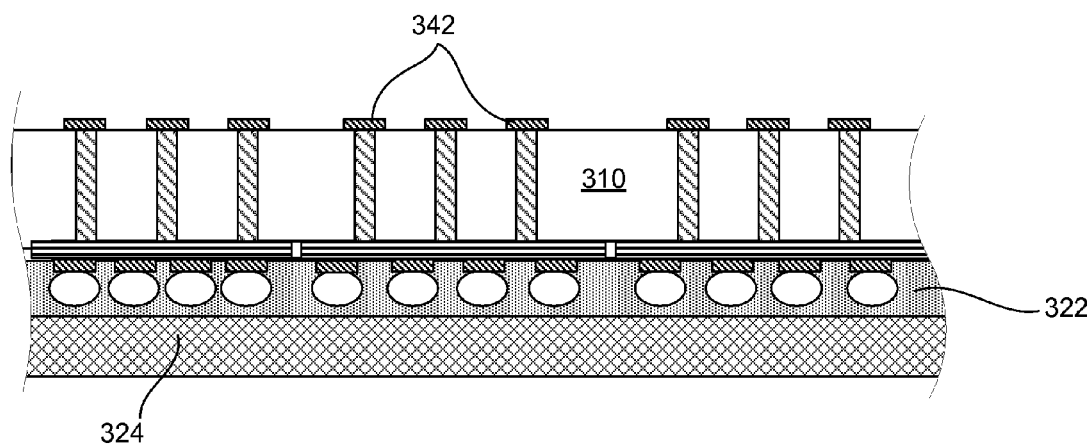

Through-die vias 332 are then prepared for connection to daughter dice by under-bump metal pads 342 as shown in FIG. 3H. As described above, under-bump metallization provides electrical contact between the through-die vias and the daughter die solder bumps.

Figure 4A:
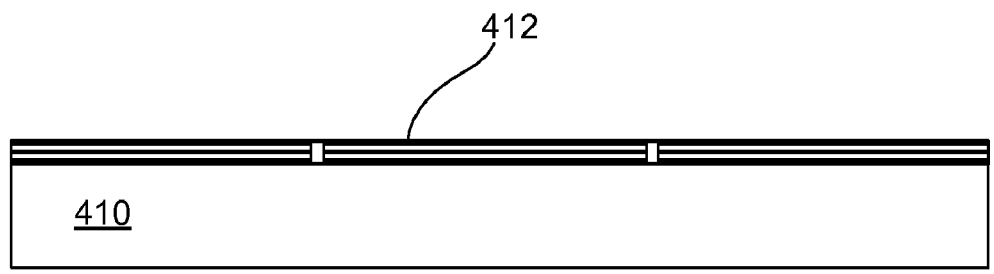
FIGS. 4A-4D illustrate the fabrication of daughter dice, including application of solder bumps, in accordance with an embodiment of the present invention.

FIGS. 4A-4D illustrate the fabrication of daughter dice in accordance with an embodiment of the present invention. FIG. 4A shows semiconductor wafer 410 and the daughter dice integrated circuits 412 formed in the active surface of the wafer.

Figure 4B:
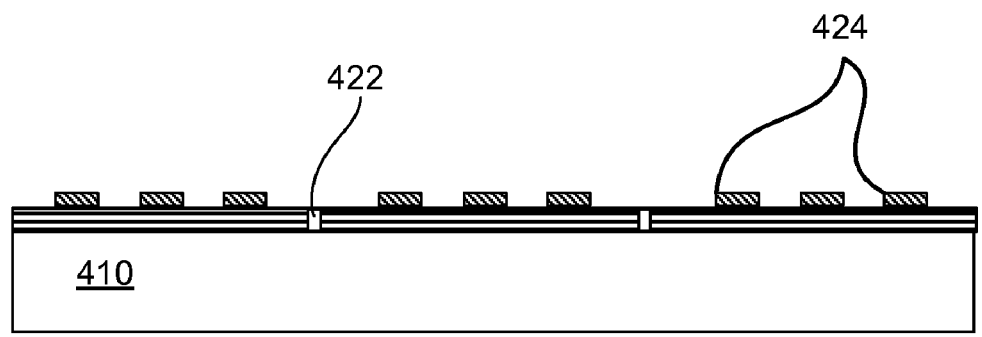
Figure 4C:
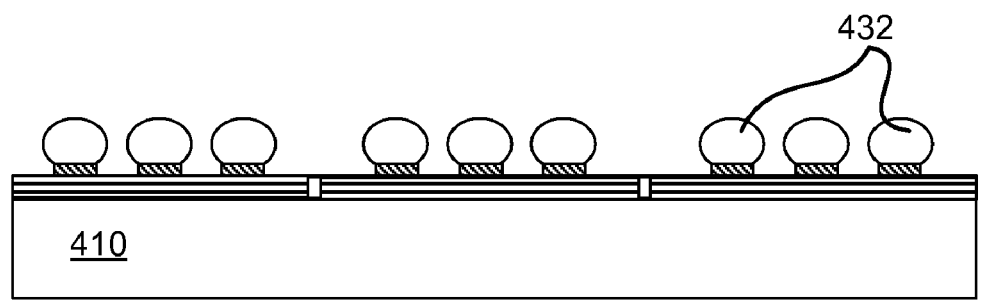

FIG. 4B shows daughter dice integrated circuits 412 receiving under-bump metal (UBM) contact pads 424. Under-bump metallization in this embodiment allows for electrical coupling between the integrated circuit and the subsequently applied solder bumps 432, shown in FIG. 4C. In this embodiment of the present invention, semiconductor wafer 410 remains undiced, or un-singulated, until the daughter die fabrication, under-bump metallization, and solder bump application are completed. In another embodiment, singulation may take place earlier or later in the process.

Figure 4D:
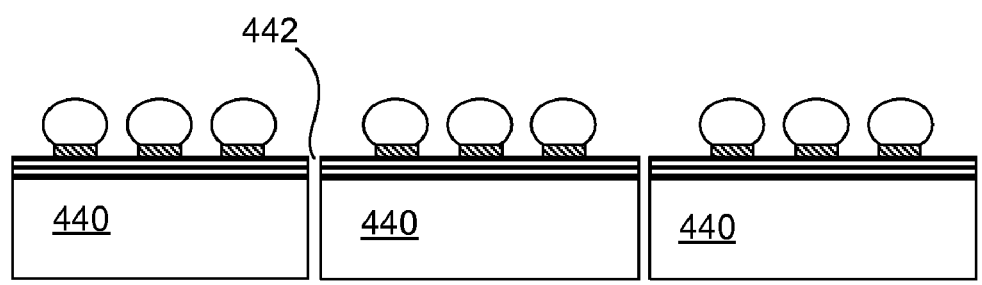

FIG. 4D illustrates the singulation of the daughter dice 440 from semiconductor wafer 410. The inter-die streets 422 are the location of the cut lines 442 when the wafer is singulated. The singulation in this embodiment results in individual daughter dice that have solder bumps attached and are ready for assembly to a mother die.

Figure 5:
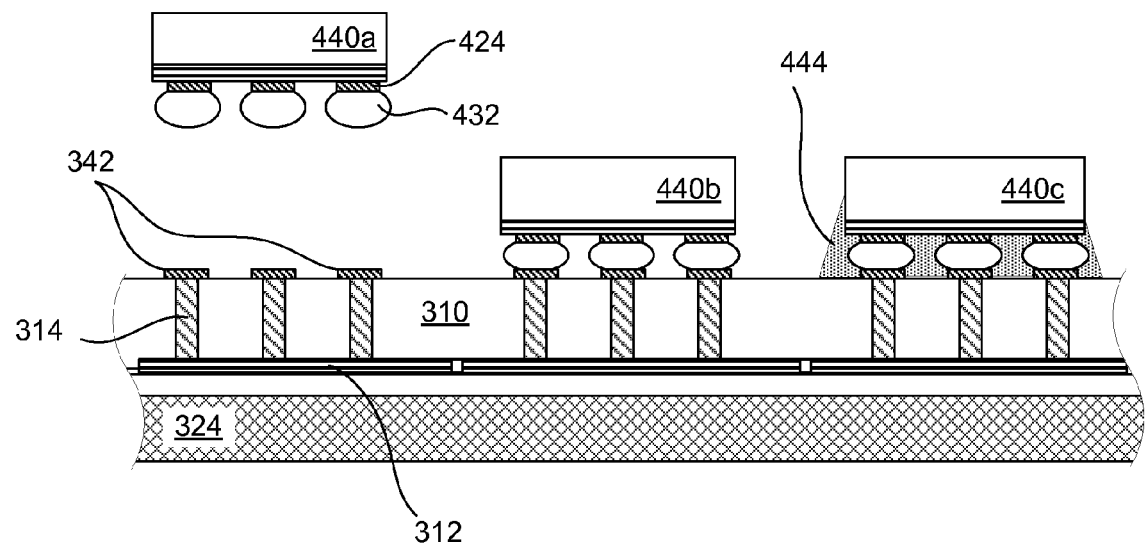
FIG. 5 illustrates mounting stacked daughter dice to the contact pads of mother dice in a semiconductor wafer in accordance with an embodiment of the present invention.

FIG. 5 illustrates the assembly of daughter dice onto mother dice, in accordance with an embodiment of the present invention. In this embodiment, daughter die 440a is shown being readied for attachment to under-bump metal pads 342 for electrical connection to mother die integrated circuit 312. The under-bump metal pads 342 provide electrical interconnection by through-silicon vias 314 with mother die 312 of semiconductor wafer 310. During attachment and other processing, in this embodiment, semiconductor 310 is held in position by substrate 324.

Daughter die 440b is shown attached. Here, solder bumps 432 provide electrical and mechanical connection between mother die under-bump metal pads 342 and daughter die under-bump metal pads 424.

One embodiment of the present invention provides underfilling of the daughter die connection. Daughter die 440c is shown after attachment and post-attachment under-filling 444. Underfilling provides mechanical and thermal protection for the daughter die connection.

Figure 6A:
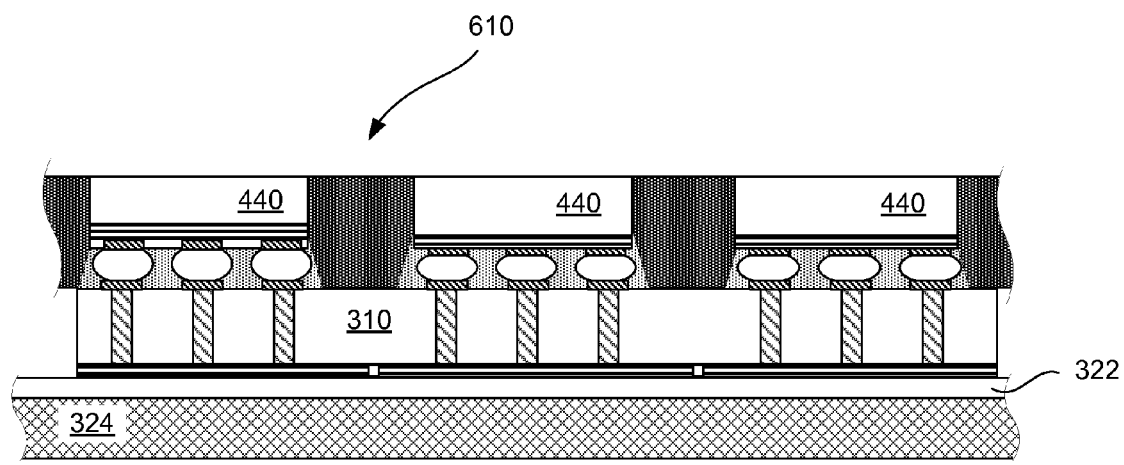
FIG. 6A illustrates back-filling of a semiconductor wafer with attached stacked daughter dice in accordance with an embodiment of the present invention.

FIG. 6A shows a plurality of daughter dice 440 attached to respective mother dice in semiconductor wafer 310. In the embodiment illustrated here, the inter-die area between the daughter dice is back-filled 610. Back-filling can provide a level surface by which the wafer assembly can be manipulated and held. In the embodiment shown, the back-filling is level with the back surface of the daughter dice. In another embodiment, back-filling can completely submerge the daughter dice. In one embodiment, the back-filling can be with a packaging material. In yet another embodiment, the back-filling provides thermal and electrical protection.

Figure 6B:
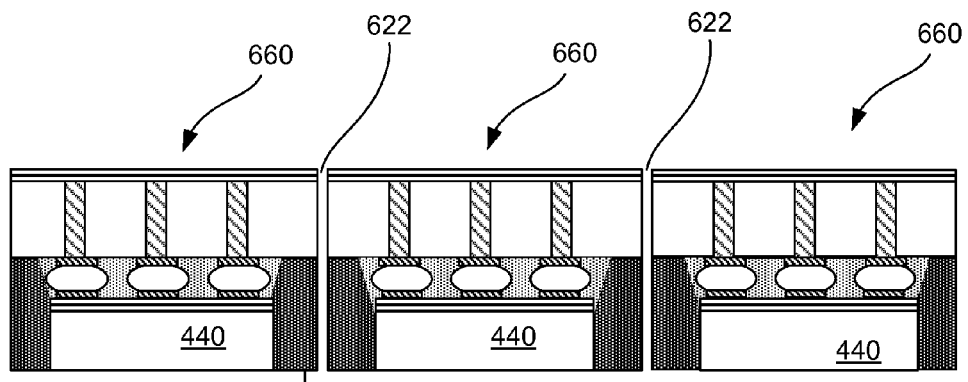
FIG. 6B illustrates a plurality of mother/daughter die integrated circuit assemblies after singulation in accordance with an embodiment of the present invention.

FIG. 6B illustrates integrated circuit assemblies 660 after singulation, in accordance with various embodiments of the present invention. In FIG. 6B, semiconductor wafer 310 has been returned to its initial processing orientation, with the active, circuitry bearing, surface shown facing upwards. It is noted here that up, down, in, out or any other word denoting orientation is used herein solely for purposes of illustration. No limitation of embodiments of the present invention is to be inferred from the use of such words.

Substrate 324 is not shown in FIG. 6B, as it has been removed from the active surface of semiconductor wafer 310. Because, in this embodiment, semiconductor wafer is held by the surface of back-filling 610, singulation can be accomplished by reference to cut lines 622. After singulation, integrated circuit assemblies 660 are individual and ready for further processing.

Figure 7A:
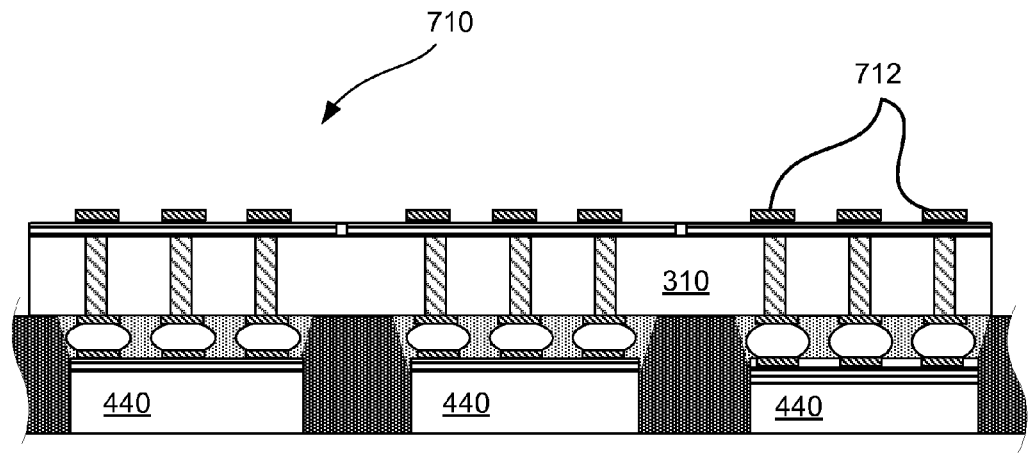
FIGS. 7A-7C illustrate an alternative method of post daughter die attachment processing in accordance with an embodiment of the present invention.
Figure 7B:
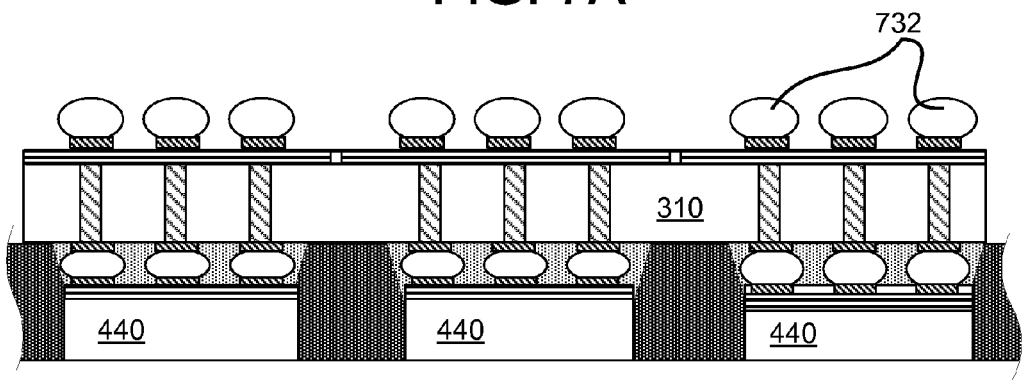
Figure 7C:
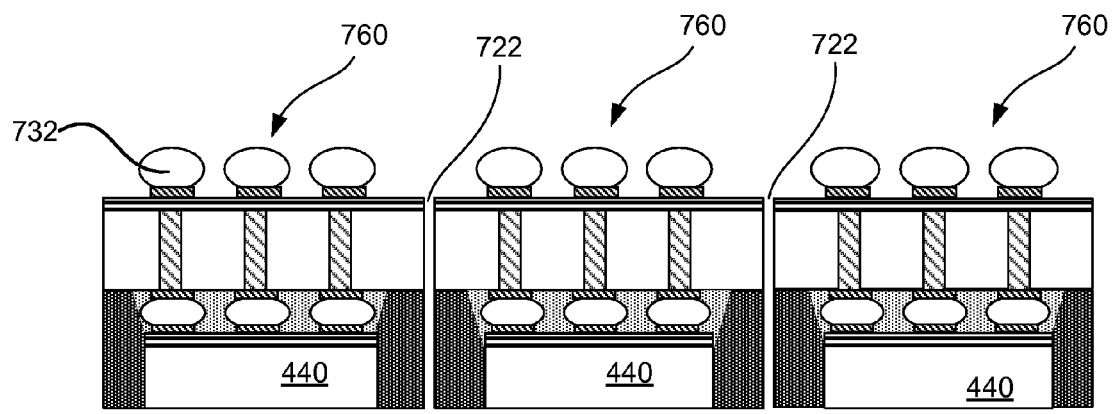

FIGS. 7A-7C illustrate alternative embodiments. In the embodiment shown in FIG. 7A, after removal of substrate 324 and the exposure of the active surface of semiconductor wafer 310, under-bump metal pads 712 are formed to provide connectibility to the mother die circuitry. In this embodiment, the facility of handling a semiconductor wafer, such as wafer 310 which comprises a plurality of integrated circuits, is used to allow under-bump metallization without the need to handle individual, singulated, integrated circuits.

In another embodiment, shown in FIG. 7B, solder bumps 732 are formed on the under-bump metal pads 712. In this embodiment, solder bumps 732 enable the connection of a mother die/daughter die assembly to be mounted to a package substrate, printed circuit board, or to some other connection.

In yet another embodiment, the semiconductor wafer, with its integrated circuits and associated solder bumps, is attached to an array of package substrates. In that embodiment, the array of substrates are fabricated in a semiconductor wafer similar to semiconductor wafer 310.

As shown in FIG. 7C, after the formation of the under-bump metal pads or, in another embodiment, after the solder bumps are formed, integrated circuit assemblies 760 are singulated from semiconductor wafer 310 by reference to cut lines 722.

In this fashion, an integrated circuit assembly comprising a stacked mother die/daughter die assembly is fabricated. The embodiments of fabrication methods shown take advantage of the speed and facility of performing many fabrication steps while the components are un-singulated, i.e., still part of the semiconductor wafer.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims and not by the above detailed description.

What is claimed is:

1. A method of fabricating an integrated circuit assembly, comprising:
   forming a mother die in a first surface of a semiconductor wafer, wherein the mother die comprises a plurality of through-die vias and wherein the mother die is one of a plurality of mother dice in the semiconductor wafer;
   wherein the semiconductor wafer in which the plurality of mother dice is formed is un-singulated;
   attaching a substrate to the first surface of the un-singulated semiconductor wafer;
   exposing an end of a through-die via of the plurality of through-die vias at a second surface of the un-singulated semiconductor wafer;
   mounting a plurality of daughter dice to the second surface of the un-singulated semiconductor wafer such that each daughter die is electrically coupled to a respective one of the mother dice by way of a through-die via of the plurality of through-die vias; and
   forming a level face on the second surface of the un-singulated semiconductor wafer by depositing packaging material over and around the plurality of daughter dice.

2. The method of claim 1, wherein the substrate is a glass wafer carrier.

3. The method of claim 1, wherein exposing an end of a through-die via comprises removing a portion of the second surface of the semiconductor wafer.

4. The method of claim 3, wherein removing a portion of the second surface of the semiconductor wafer comprises back-grinding the second surface while the semiconductor is held by the substrate.

5. The method of claim 3, wherein exposing an end of a through-die via further comprises forming an under-bump metal pad electrically coupled to the through-die via.

6. The method of claim 1, wherein mounting a daughter die comprises attaching the daughter die to the plurality of through-die vias by means of solder bumps.

7. The method of claim 6, further comprising underfilling the daughter die.

8. The method of claim 7, wherein the underfilling provides thermal and mechanical protection.

9. The method of claim 1, further comprising singulating the mother die from the semiconductor wafer after the mounting of the daughter die un-singulated semiconductor wafer.

10. The method of claim 9, wherein singulating the mother die from the semiconductor wafer is accomplished while the semiconductor wafer is held by the level surface.

11. A semiconductor wafer, comprising:
    a plurality of mother dice, at least one mother die comprising a plurality of through-die vias, formed in the semiconductor wafer, and each mother die being formed in a first surface of the semiconductor wafer;
    wherein the semiconductor wafer in which the plurality of mother dice is formed is un-singulated;
    a plurality of daughter dice mounted on the second surface of the un-singulated semiconductor wafer, each daughter die electrically coupled to a respective one of the plurality of mother dice;
    packaging material deposited over and around the daughter dice, the packaging material forming a level face on a second surface of the un-singulated semiconductor wafer;
    wherein each daughter die is electrically coupled to the respective mother die by means of connections to the through-die vias;
    wherein the through-die vias are exposed to connection at the second surface of the un-singulated semiconductor wafer; and
    wherein the semiconductor wafer is attached to a substrate by the first surface of the un-singulated semiconductor wafer.

12. The semiconductor wafer of claim 11, wherein the substrate is a wafer carrier substrate.

13. The semiconductor wafer of claim 11, further comprising mother die solder bumps electrically coupled to contact points of the at least one mother die, the solder bumps being attached to the first surface of the semiconductor wafer.

14. The semiconductor wafer of claim 13, wherein the mother die solder bumps have a higher melting point than the daughter die solder bumps.

15. A computer-readable storage medium having stored thereon a set of computer-executable instructions for executing a method of fabricating an integrated circuit assembly, the method comprising:
    forming a mother die in a first surface of a semiconductor wafer, wherein the mother die comprises a plurality of through-die vias and wherein the mother die is a one die of a plurality of mother dice in the semiconductor wafer;
    wherein the semiconductor wafer in which the plurality of mother dice is formed is un-singulated;
    attaching a substrate to the first surface of the semiconductor wafer;
    exposing an end of a through-die via of the plurality of through-die vias at a second surface of the semiconductor wafer;
    mounting a plurality of daughter dice to the second surface of the un-singulated semiconductor wafer such that each daughter die is electrically coupled to a respective one of the mother die by means of a through-die via of the plurality of through-die vias; and
    forming a level face on the second surface of the un-singulated semiconductor wafer by depositing packaging material over and around the plurality of daughter dice.

16. The computer-readable storage medium of claim 15, wherein exposing an end of a through-die via comprises removing a portion of the second surface of the semiconductor wafer.

17. The computer-readable storage medium of claim 16, the method further comprising underfilling the daughter die.

18. The computer-readable storage medium of claim 15, wherein the mother die is of a plurality of mother dice formed in the semiconductor wafer, and wherein the daughter die is of a plurality of daughter dice, each daughter die of the plurality of daughter dice being mounted to a mother die of the plurality of mother dice.

19. The storage medium of claim 15, wherein the computer-executable instructions for executing a method of fabricating an integrated circuit assembly further include instructions for singulating the mother die from the semiconductor wafer after the mounting of the daughter die un-singulated semiconductor wafer.

* * * * *